United States Patent [19]

Yang

[11] Patent Number: 5,180,680
[45] Date of Patent: Jan. 19, 1993

[54] METHOD OF FABRICATING ELECTRICALLY ERASABLE READ ONLY MEMORY CELL

[75] Inventor: Ming-Tzong Yang, Hsinchu, Taiwan

[73] Assignee: United Microelectronics Corporation, Hsinchu, Taiwan

[21] Appl. No.: 701,701

[22] Filed: May 17, 1991

[51] Int. Cl.$^5$ .......................................... H01L 21/70
[52] U.S. Cl. .................................... 437/38; 437/43; 437/48; 437/203
[58] Field of Search ................... 437/38, 43, 48, 52; 457/23.4

[56] References Cited

U.S. PATENT DOCUMENTS

| 4,975,384 | 12/1990 | Baglee | 437/43 |
| 5,045,490 | 9/1991 | Esquivel et al. | 437/52 |
| 5,049,515 | 9/1991 | Tzeng | 437/38 |

FOREIGN PATENT DOCUMENTS

| 0046760 | 2/1988 | Japan | 437/52 |
| 0102372 | 5/1988 | Japan | 437/52 |
| 0150364 | 6/1989 | Japan | 437/52 |

Primary Examiner—Olik Chaudhuri
Assistant Examiner—Ourmazd S. Ojan
Attorney, Agent, or Firm—George O. Saile

[57] ABSTRACT

An EPROM cell on a semiconductor substrate having a trench containing a source region in the bottom thereof, insulated floating gates on opposite sidewalls of the trench, and a control gate overlying the floating gates. Drain regions are provided beneath the top surface of the substrate, adjacent to the floating gates, which are electrically connected by a conductive stripe on the surface of the substrate that extends transverse to the trench axis.

A method of fabricating an EPROM cell by forming a trench in a semiconductor substrate. An insulated floating gate of polycrystalline silicon is formed on the sidewalls of the trench. Doped regions are formed on the surface of the substrate and in the trench bottom. A control gate is formed over the floating gate. Electrical contact is established to the doped regions and the control gate.

15 Claims, 3 Drawing Sheets

METHOD OF FABRICATING ELECTRICALLY ERASABLE READ ONLY MEMORY CELL

BACKGROUND OF THE INVENTION (1) Field of the Invention

The present invention relates to an erasable electrical programmable memory cell of a type useful in VLSI technology, more specifically to an EPROM cell capable of providing a means to increase the density of cell array devices.

(2) Description of the Invention

More efficient utilization of device area in VLSI technology is a prominent objective in order to increase the density and number of devices and memory cells on a semiconductor chip in order to reduce cost and increase the speed of operation. A known technique is to place various elements, i.e. transistors, capacitors, etc. in trenches to achieve greater element density. Examples of such utilization of trench structures in EPROM devices are shown in U.S. Pat. Nos. 4,975,383 and 4,975,384.

Accordingly, an object of this invention is to describe an improved method and resulting device structure for making highly dense EPROM products.

SUMMARY OF THE INVENTION

There is provided an electrically erasable read only memory (EPROM) cell on a semiconductor substrate having a trench containing a source region at the bottom, floating gates on opposite sidewalls, separated from the substrate by a gate insulation layer, and a control gate overlying the floating gates. Drain regions are provided beneath the top surface of the substrate adjacent and in abutting relation, the sidewalls of the trench. The drain regions are electrically connected by a conductive stripe on the surface of the substrate that is positioned transverse to the longitudinal axis of the trench.

The method of fabricating the EPROM cell of the invention involves forming a trench in a semiconductor substrate, forming a gate insulation layer on the surface of the trench, forming polycrystalline silicon floating gate layers on opposite sidewalls of the trench, implanting dopants in the surface of the substrate and bottom of the trench, forming a control gate over the floating gate electrodes, forming a conductive stripe transverse to the trench, and in electrical contact to the regions on either side of the trench, and establishing electrical contact to the region in the bottom of the trench.

DETAILED DESCRIPTION OF PREFERRED EMBODIMENTS OF THE CELL

Figure 1:
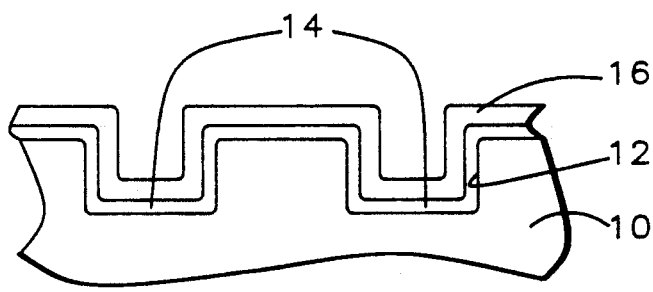
FIGS. 1 through 4 and 6 is a sequence of schematic cross sectional views, in greatly enlarged scale, that depicts one method embodiment of the invention for fabricating a EPROM cell.

Referring now to the Figs. of the drawing, there is illustrated, methods for forming two preferred specific embodiments of EPROM cell of the invention and methods for fabricating them. It should be understood that these embodiments are not intended to severely limit the scope of this invention, since it should be understood by those skilled in the art that modifications could be made to the structures and methods of fabricating without departing from the scope and spirit of the invention.

As shown in FIG. 1, a trench 12 is formed in a semiconductor substrate 10. In practice, when a device with an array of cells is produced, a plurality of parallel elongated trenches is formed in the substrate 10. The substrate can be any suitable semiconductor material, but is preferably a monocrystalline silicon substrate, with a crystal orientation of [100], and a background doping of a concentration of P type dopant in the range of 1 E 15 to 1 E 17 cm$^{-3}$. The trench 12 will preferably have a depth in the range of 3000 to 10,000 Angstroms, a width in the range of 0.5 to 2.0 Micrometers, and spacing in the range of 0.1 to 2.0 micrometers. Most preferably the trench 12 has a depth of 0.5 to 0.7 micrometers, a width of 0.5 to 1.5 micrometers, and a spacing of 0.1 to 1.0 micrometers. The trench is formed by depositing a masking layer of a photoresist, and exposing and developing it to form openings that define the trench. The trenches are then formed by anisotropic reactive ion etching (RIE), most preferably by etching in a conventional anisotropic etching reactor using as the etching specie chlorine, hydrogen bromide, sulfur hexafluoride or carbon tetrachloride.

After the trench has been formed, the photoresist layer is removed and a first insulating layer 14 is formed on the surface of substrate 10, including the sidewalls and bottoms of the trench 12. The layer 14 will serve as a gate insulating layer in the trench and is preferably a layer of thermal SiO$_2$, when the substrate is silicon, with a thickness on the order of 50 to 300 Angstroms. This layer 14 can be formed by heating the substrate to a temperature of 900° to 1000° C., in the atmosphere of dry oxygen for a time of ½ to 3 hours. Alternatively, the first layer 14 can be a composite layer consisting of layers of silicon dioxide, silicon nitride, and silicon dioxide, respectfully, having an overall thickness in the range of 100 to 400 angstroms. A first layer 16 of polycrystalline silicon is deposited on the surface of trench 12. The layer 16 preferably has a dopant concentration on the order of 1 E 19 to 1 E 21 cm$^{-3}$ either by deposition of undoped polysilicon and then doping with phosphorus oxychloride or P31 ion implantation, or doped in situ, and a thickness in the range of 500 to 3000 Angstroms.

Figure 2:
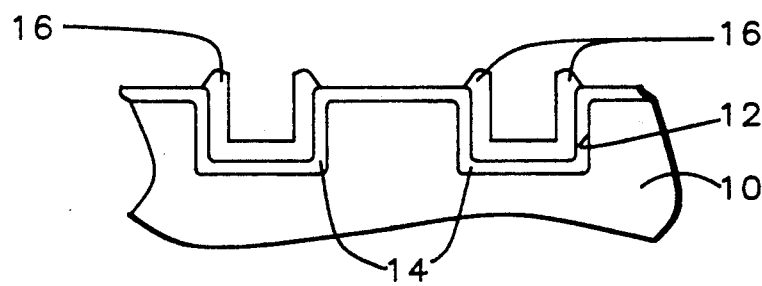
Figure 3:
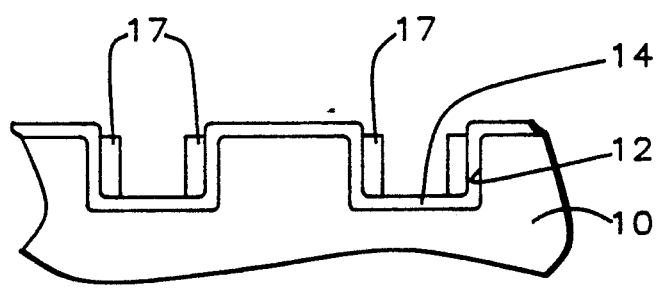

The major portion of layer 16 is then removed leaving only areas on opposing sidewalls of the trench 12. In forming an array of cells, a plurality of opposed area, which will constitute floating gates 17, are formed in the trench 12 with a longitudinal spacing of approximately 0.5 to 3.0 micrometers. This configuration can be seen more clearly in plan views FIGS. 7 and 8. Layer 16 is preferably shaped by a two step process. The portions of layer 16 on the surface are removed by masking and subtractive etching, as indicted in FIG. 2. The masking layer (not shown) is removed and the substrate exposed to anisotropic dry etch. This removes the portion of layer 16 on the bottom of trench 12 and takes a portion off the top edges, resulting in floating gates 17, as shown in FIG. 3.

Figure 4:
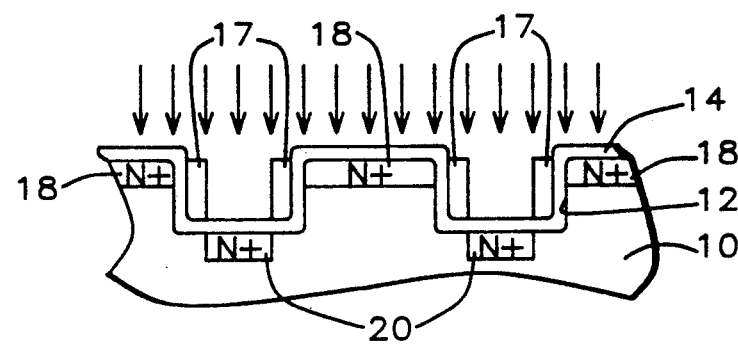

As indicated in FIG. 4, dopant ions are introduced into the substrate 10, adjacent to the surface between the trenches, forming drain regions 18 and in the bottom of the trench between the gate electrodes 17, to form source regions 20. Preferably arsenic ions are implanted with an acceleration voltage of 40 to 120 KEV, with a dosage in the range of 5 E 14 to 1 E 16 ions/cm$^2$ followed by an annealing step at conditions 800° to 900° C. The resultant regions 18 and 20 will preferably have an average dopant concentration on the order of 1 E 19 to 1 E 21 cm$^{-3}$.

Figure 5A:
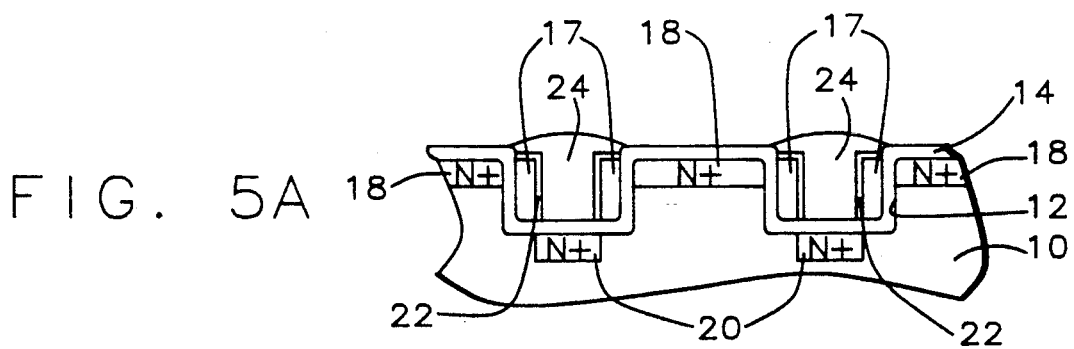
FIG. 5a and 5c are sectional views that illustrate alternate embodiments of the basic process of the FIGS. 1 through 6 embodiment.
Figure 5B:
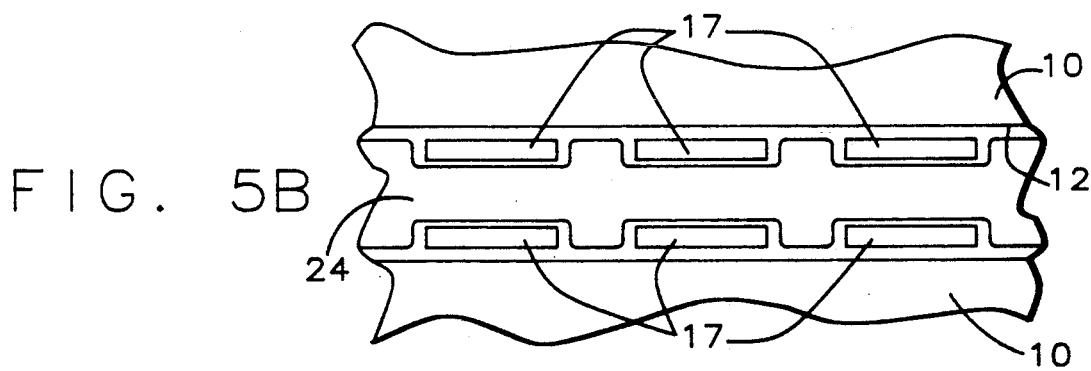
FIG. 5b and 5d are top plan views of FIG. 5a and 5c respectfully.
Figure 5C:
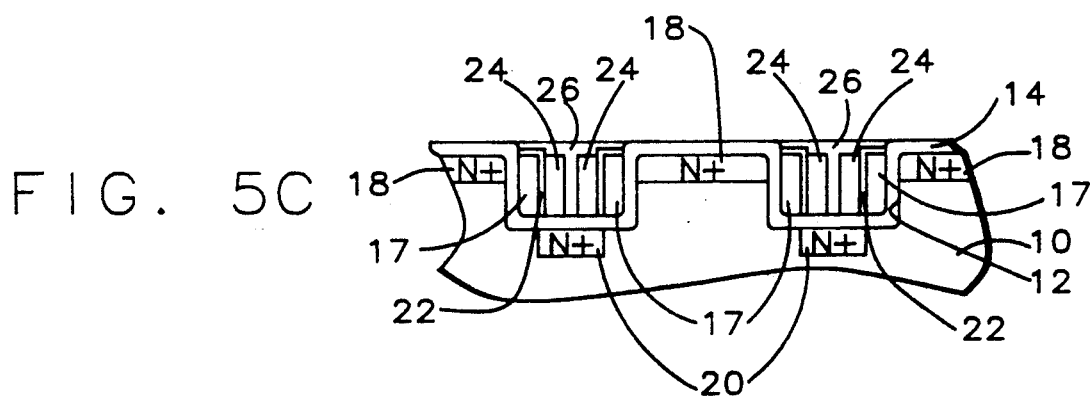

As shown in FIGS. 5a and 5c, a second insulating layer 22 is formed over floating gate electrodes 17. This layer can be a thermal SiO$_2$ layer, a chemical vapor deposition SiO$_2$, or a composite layer of SiO$_2$ and Si$_3$N$_4$. The techniques for forming such layers are well known. The layer 22 preferably has a physical thickness in the range of 100 to 400 Angstroms and an equivalent dielectric layer (silicon dioxide) thickness of between about 50 to 300 Angstroms.

Figure 5D:
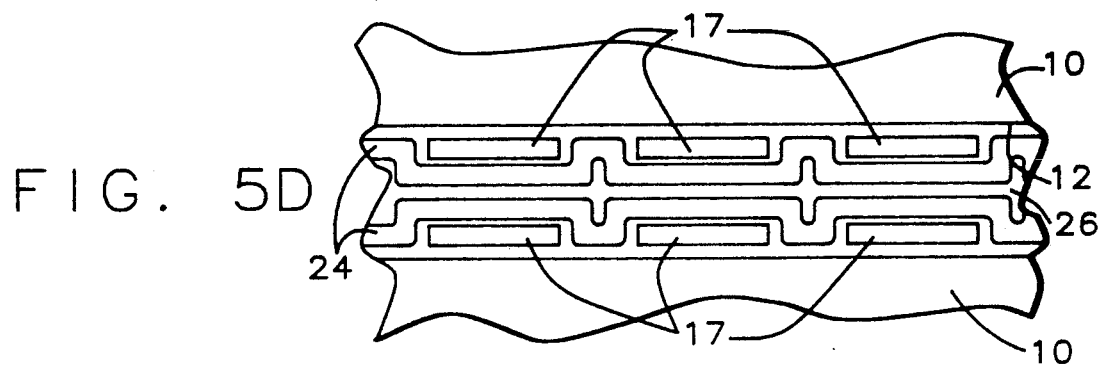

A second polycrystalline silicon layer 24 is deposited in overlying relation to gates 17 in trench 12. The second layer of polycrystalline silicon has a thickness of between about 500 to 5000 Angstroms. Two different configurations of layer 24, which will serve as a control gate, are shown in FIGS. 5a and 5c. In 5a and 5b, the layer 24 is shown completely filling the remaining space in trench 12. In FIGS. 5c and 5d a layer 24 overlays gates 17, and the remaining area filled with an insulating material. In forming control gate electrode 24, a polycrystalline silicon layer is deposited on substrate 10, in the same manner as layer 16. In fashioning control gates 24 in FIGS. 5a and 5b, the trench area is masked and the unmasked areas of the layer removed by etching. This leaves a gate electrode that extends substantially the length of the trench in overlying relation to floating gates 17. In the embodiment of FIGS. 5c and 5d, the polycrystalline silicon layer is fashioned by a two step process described in forming layer 16. The space remaining in the trench is filled with an insulating material 26. This insulating layer 26 can be phosphosilicate glass, borophosphosicicate glass or a spin on glass sandwich composed of silicon oxide, spin on glass and silicon oxide. Where the glasses are used, they are deposited by atmospheric chemical vapor deposition or plasma enhanced chemical vapor deposition using silane and dopants of phosphorus and boron as appropriate. The spin on glass can be a silicate or a siloxane material as is known in the art.

Figure 6:
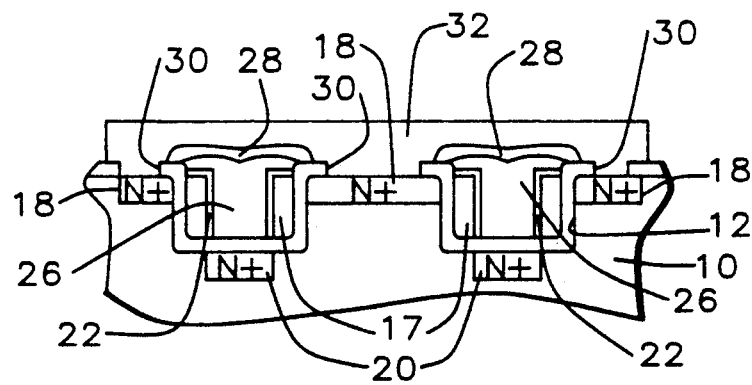

As shown in FIG. 6, an third insulating layer 28 is formed over control gate 26. The thickness of the third insulating layer is preferrably between about 200 to 5000 Angstroms. Layer 28 can be any suitable layer, such as thermal SiO$_2$, chemical vapor deposition SiO$_2$, or a composite layer. Openings 30 are formed over regions 18, and parallel conductive stripes 32 formed over openings 30. The strips 32 are transverse to trenches 12. Preferably stripes 32 are doped polycrystalline silicon, which constitutes a part of the metallurgy of the resultant cell array.

Figure 7:
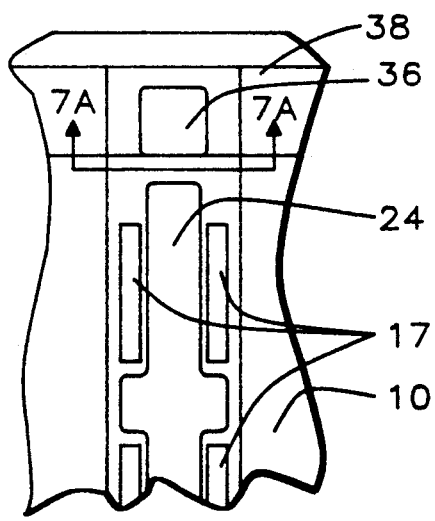
FIG. 7 is a top plan view illustrating the mode and structure of forming electrical contact to the source region.
Figure 7A:
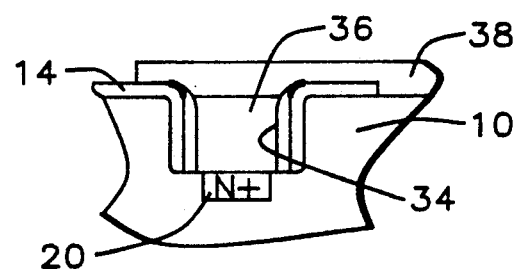
FIG. 7a is a crass sectional view taken on line 7a of FIG. 7.

A electrical contact is made to source region 20, as shown in FIGS. 7 and 7a. The contact is preferably in the end of the trench 12. As shown, the control gate 26 is terminated short of the end of the trench, and the resultant opening filled with insulating material in the foregoing described steps. An opening 34 is made to region 20, as most clearly shown in FIG. 7a, and the opening filled with a conductive material 36, preferably tungsten, titanium-tungsten, or polycrystalline silicon using well known etching and deposition techniques. A suitable metallurgy stripe 38 is deposited to contact plug 36 to supply the voltage to region 20 which is necessary for operation. The metallurgy stripe 38 is typically aluminum, aluminum/silicon/copper, aluminum/copper, or the like.

Figure 8:
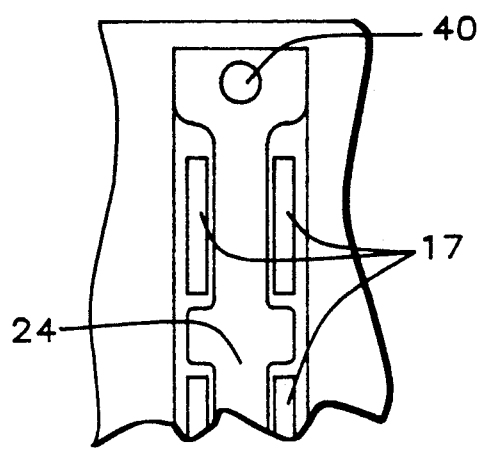
FIG. 8 is a top plan view showing a structure for providing an electrical connection to the control gate.

The control gate 26 is also provided with an electrical control at the end of the trench 12. A suitable electrical connection 40 is shown in FIG. 8. The metallurgy for the electrical connection 40 is the same material as for stripe 38.

The operation of the cell of the invention may be understood by those skilled in the art with reference to the following table:

TABLE

|  | $V_G$ (control gate), 40 | $V_D$ (drain), 32 | $V_S$ (source), 38 |
|---|---|---|---|
| WRITE | 12.5 Volts | 6 to 8 Volts | 0 Volts |
| READ | 5.0 Volts | 1.5 to 2 Volts | 0 Volts |
| ERASE | 0 Volts | 0 Volts | 12.5 Volts |

It is of course understood that erasure can be also accomplished by ultraviolet (UV) light.

While the invention has been particularly shown and described with reference to the preferred embodiments thereof, it is well understood by those skilled in the art that various changes and modification can be make in the invention without departing from the spirit and scope of the invention.

What is claimed is:

1. A method of fabricating an electrically programmable read only memory cell on a semiconductor substrate comprising:

forming a trench in said substrate, forming a first insulating layer over the surface of said substrate, including the sidewalls and bottom of said trench, forming first individual polycrystalline silicon layers on opposed sidewalls of said trench, which form floating gates, implanting a first type dopant into said substrate thereby forming a continuous doped region in the bottom of said trench, and also individual doped regions on opposite sides of said trench, adjacent to the top surface of said substrate, forming a second insulating layer over said first individual polycrystalline silicon layers, forming an elongated second continuous polycrystalline silicon layer in said trench over said first individual polycrystalline silicon layers, forming a third insulating layer over said second polycrystalline silicon layer, forming contact openings in said first insulating layer on the top surface of said substrate to said individual doped regions that are adjacent to said first individual polycrystalline silicon layers in said trench, forming a contact stripe over and transverse to said trench that contacts said substrate through said contact openings, which establish electrical contact to said first type individual doped regions, forming an electrical contact to the first type doped continuous region under said trench, and forming an electrical contact to said elongated second polycrystalline silicon layer to thereby form a control gate.

2. The method of claim 1 wherein said trench is formed by anisotropic reactive ion etching.

3. The method of claim 2 wherein said trench has a depth in the range of 0.5 to 2.0 micrometers and a width in the range of 0.5 to 1.5 micrometers.

4. The method of claim 2 wherein said semiconductor substrate is monocrystalline silicon, and said first insulating layer is formed by thermally oxidizing said substrate, the resultant thickness of said first insulating layer being of the order of 50 to 300 Angstroms.

5. The method of claim 2 wherein said first insulating layer is a composite layer of $SiO_2$, $Si_3N_4$ and $SiO_2$, and having an overall thickness in the range of 100 to 400 Angstroms.

6. The method of claim 2 wherein said first polycrystalline silicon layer has a thickness in the range of 500 to 3000 Angstroms.

7. The method of claim 6 wherein said first polycrystalline silicon layer is deposited on the surface of the substrate, the top surface portions removed by masking the trench portions and subtractive etching the exposed portions, and subsequently removing the mask and exposing the remaining layer to an anisotropic dry etch that removes the portions on the bottom of the trench, and the upper end portions on the sidewalls of the trench.

8. The method of claim 7 wherein said second insulating layer is $SiO_2$ with a thickness in the range of 50 to 300 Angstroms and is formed by chemical vapor deposition.

9. The method of claim 7 wherein said second insulating layer is a composite layer of $SiO_2$, $Si_3N_4$ and $SiO_2$, with a thickness in the range of 100 to 400 Angstroms.

10. The method of claim 6 wherein said elongated second polycrystalline silicon layer has a thickness in the range of 500 to 5000 Angstroms with a third insulating layer of $SiO_2$ with a thickness in the range of 200 to 5000 Angstroms.

11. The method of claim 6 wherein said elongated second polycrystalline silicon layer has a thickness in the range of 500 to 5000 Angstroms with a third overlying insulating layer being a layer of chemical vapor deposited silicon oxide.

12. The method of claim 6 wherein said elongated second polycrystalline silicon layer completely fills said trench.

13. The method of claim 2 wherein said electrical contact to said doped region under the trench is formed at the end of a trench by etching an opening to the bottom of said trench, and filling the opening with a conductive metal.

14. The method of claim 2 wherein said electrical contact to said elongated second polycrystalline silicon layer is formed at the end of said trench beyond said floating gates by forming an opening in said third insulating layer.

15. A method of fabricating an electrically programmable read only memory cell on a semiconductor substrate comprising:

forming a trench in said substrate, forming a first composite insulating layer over the surface of said substrate, including the sidewalls and bottom of said trench, said composite layer consisting of a layer of $SiO_2$, an intermediate layer of Silicon Nitride, and a layer of $SiO_2$, having an overall thickness in the range of 100 to 400 Angstroms, forming first individual polycrystalline silicon layers on opposed sidewalls of said trench, which form floating gates, implanting a first type dopant into said substrate thereby forming a continuous doped region in the bottom of said trench, and also individual doped regions on opposite sides of said trench, adjacent to the top surface of said substrate, forming a second insulating layer over said first individual polycrystalline silicon layers, forming an elongated second continuous polycrystalline silicon layer in said trench over said first individual polycrystalline silicon layers, forming a third insulating layer over said second polycrystalline silicon layer, forming contact openings in said first insulating layer on the top surface of said substrate to said individual doped regions that are adjacent to said first individual polycrystalline silicon layers in said trench, forming a contact stripe over and transverse to said trench that contacts said substrate through said contact openings, which establish electrical contact to said first type individual doped regions, forming an electrical contact to the first type doped continuous region under said trench, and forming an electrical contact to said elongated second polycrystalline silicon layer to thereby form a control gate.

* * * * *